United States Patent
Zhao et al.

(10) Patent No.: US 10,950,153 B2
(45) Date of Patent: Mar. 16, 2021

(54) SCAN DRIVING CIRCUIT AND DRIVING METHOD THEREOF, ARRAY SUBSTRATE AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Jian Zhao, Beijing (CN); Mo Chen, Beijing (CN); Jilei Gao, Beijing (CN); Yang Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD, Hefei (CN)

( * ) Notice: Subject to any disclaimer, the term of this patent is extended or adjusted under 35 U.S.C. 154(b) by 326 days.

(21) Appl. No.: 16/062,763

(22) PCT Filed: Nov. 15, 2017

(86) PCT No.: PCT/CN2017/111183
§ 371 (c)(1),
(2) Date: Jun. 15, 2018

(87) PCT Pub. No.: WO2018/201690
PCT Pub. Date: Nov. 8, 2018

(65) Prior Publication Data
US 2020/0265762 A1      Aug. 20, 2020

(30) Foreign Application Priority Data
May 5, 2017   (CN) .......................... 201710312219.9

(51) Int. Cl.
*G09G 3/20* (2006.01)
*G11C 19/28* (2006.01)

(52) U.S. Cl.
CPC ................ *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 2005/0104836 A1 | 5/2005 | Lin et al. | |
| 2006/0197554 A1* | 9/2006 | Jinta | G11C 19/184 326/81 |

(Continued)

FOREIGN PATENT DOCUMENTS

| CN | 104732939 A | 6/2015 |
| CN | 105761663 A | 7/2016 |

(Continued)

OTHER PUBLICATIONS

Interational Search Rerpot of the PCT application No. PCT/CN2017/111183 dated Feb. 13, 2018.

*Primary Examiner* — Matthew Yeung
(74) *Attorney, Agent, or Firm* — Fay Sharpe LLP (57) ABSTRACT

Provided are a scan driving circuit and driving method thereof, array substrate and a display device. The scan driving circuit includes output ends at m stages, input circuits at m stages, and q shift register circuits. A first end of the input circuit at the i-th stage is connected to the output end at the (i−1)-th stage, and i is any integer greater than 1 and less than m+1. Any shift register circuits is respectively connected to k output ends, and second ends of k input circuits, and the k input circuits have a same combination of stage numbers as k output ends, all stage numbers in same combination of stage numbers have the same parity, and k is greater than 1 and less than m. The shift register circuit is (Continued)

configured to output a scanning signal to one output ends, and outputting the scanning signal to which output ends is indicated by an external control signal.

20 Claims, 4 Drawing Sheets

(56) References Cited

U.S. PATENT DOCUMENTS

| | | | | |
|---|---|---|---|---|
| 2008/0101529 A1* | 5/2008 | Tobita | ............... | G11C 19/28 |
| | | | | 377/64 |
| 2016/0300623 A1* | 10/2016 | Yang | ............... | G11C 19/28 |
| 2017/0039968 A1 | 2/2017 | Chen et al. | | |
| 2018/0211717 A1 | 7/2018 | Feng et al. | | |

FOREIGN PATENT DOCUMENTS

| | | | |
|---|---|---|---|
| CN | 105895046 | A | 8/2016 |
| CN | 106898292 | A | 6/2017 |
| KR | 20080001403 | A | 1/2008 |

\* cited by examiner

SCAN DRIVING CIRCUIT AND DRIVING METHOD THEREOF, ARRAY SUBSTRATE AND DISPLAY DEVICE

CROSS-REFERENCE TO RELATED APPLICATION

This application is a 371 of PCT Patent Application Serial No. PCT/CN2017/111183 filed Nov. 15, 2017, which claims priority to Chinese Patent Application No. 201710312219.9, filed with the State Intellectual Property Office on May 5, 2017 and titled "SCAN DRIVING CIRCUIT AND DRIVING METHOD THEREOF, ARRAY SUBSTRATE AND DISPLAY DEVICE", the entire contents of which are incorporated herein by reference.

TECHNICAL FIELD

The present disclosure relates to a scan driving circuit and a driving method thereof, an array substrate and a display device.

BACKGROUND

The Gate driver On Array (GOA) technology, compared with conventional processes, may not only omit a circuit board carrying a gate driver and achieve a symmetrical design on both sides of a display panel, but also omit a chip bonding area at an edge of the display panel and a routing area such as a fan-out area, which facilitates implementation of a narrow frame design. Also, since the GOA technology may omit a chip bonding process in a row direction, this is greatly helpful for the overall throughput and the yield improvement. In a related GOA design, several stages of GOA units having the same structure are each connected to one row scan line, and based on a cascade relationship among the GOA units, a scanning signal may be outputted line by line on several row scan lines at the drive of an external signal.

With the rapid development of display technology, the market sets higher requirements on the aesthetic appearance of display products, which makes further narrowing of the frame become an important requirement for numerous display products. And with the continual simplification of a circuit structure inside the GOA unit, the number of Thin Film Transistors (TFTs) in each GOA unit is difficult to be further reduced under the premise of satisfying application requirements.

SUMMARY

There are provided in the present disclosure a scan driving circuit and driving method thereof, an array substrate and a display device.

In a first aspect, the present disclosure provides a scan driving circuit, including output ends at m stages, input circuits at m stages, and q shift register circuits, and q is a positive integer less than an integer m;

where a first end of the input circuit at the i-th stage is connected to the output end at the (i−1)-th stage, and i is any integer greater than 1 and less than m+1; any one of the shift register circuits is respectively connected to k output ends, and connected to second ends of k input circuits, and the k input circuits have a same combination of stage numbers as the k output ends, all of the stage numbers in the same combination of stage numbers have a same parity, and k is greater than 1 and less than m; and the shift register circuit is configured to output a scanning signal to one of the connected k output ends, and outputting the scanning signal to which one of the output ends is indicated by an external control signal.

In a possible implementation, the input circuit is configured to switch the shift register circuit connected to a second end of the input circuit to a charged state when a first end of the input circuit receives a scanning signal; the shift register circuit is configured to output the scanning signal to one of the connected k output ends from a first toggling time of a clock signal after being switched to the charged state.

In a possible implementation, the scan driving circuit further includes reset circuits at m stages;

where a first end of the reset circuit at the j-th stage is connected to the output end at the (j+1)-th stage, and j is any integer greater than 0 and less than m; the shift register circuits respectively connected to the k output ends are further connected to second ends of k reset circuits, and the k reset circuits have a same combination of stage numbers as the k output ends; and the reset circuit is configured to cause the shift register circuit connected to a second end of the reset circuit to stop outputting a scanning signal when a first end of the reset circuit receives the scanning signal.

In a possible implementation, the external control signal is provided by k control signal lines, the shift register circuit includes an output sub-circuit and k transistors, and the output sub-circuit includes an output node;

where the output sub-circuit is configured to output a scanning signal to the output node;
each of first poles of the k transistors is connected to the output node;
each of gates of the k transistors is connected to one of the k control signal lines;
each of second poles of the k transistors is connected to one of the k output ends;
where the first pole and the second pole are one of a source and a drain, respectively.

In a possible implementation, where the shift register circuit includes an output sub-circuit, the output sub-circuit includes an output node, and the output sub-circuit further includes a first transistor and a first capacitor, the input circuit includes a second transistor;

where a gate of the first transistor is connected to a first node, a second pole of the first transistor is connected to the output node; and the first node is connected to the second ends of k input circuits;

in the shift register circuit in which all of stage numbers in a combination of stage numbers corresponding to the shift register circuit are odd, a first pole of the first transistor is connected to a first clock signal line; and in the shift register circuit in which all of stage numbers in a combination of stage numbers corresponding to the shift register circuit are even, the first pole of the first transistor is connected to a second clock signal line; and the first clock signal line and the second clock signal line provide one of a non-inverted clock signal and an inverted clock signal, respectively;

a first end of the first capacitor is connected to the first node, and a second end of the first capacitor is connected to the output node;

a gate of the second transistor is connected to a first end of the input circuit, the first pole of the second transistor is connected to a first level voltage line or the first end of the input circuit in which the second transistor is located, and a second pole of the second transistor is connected to the second end of the input circuit in which the second transistor is located;

where the first pole and the second pole are one of a source and a drain, respectively.

In a possible implementation, the shift register circuit includes an output sub-circuit, the output sub-circuit includes an output node, and the output sub-circuit further includes a first transistor, a first capacitor, a third transistor, and a fourth transistor; the reset circuit includes a fifth transistor;

where a gate of the first transistor is connected to a first node, a second pole of the first transistor is connected to the output node; and the first node is connected to the second ends of k input circuits;

in the shift register circuit in which all of stage numbers in a combination of stage numbers corresponding to the shift register circuit are odd, a first pole of the first transistor is connected to a first clock signal line; and in the shift register circuit in which all of stage numbers in a combination of stage numbers corresponding to the shift register circuit are even, the first pole of the first transistor is connected to a second clock signal line; and the first clock signal line and the second clock signal line provide one of a non-inverted clock signal and an inverted clock signal, respectively;

a first end of the first capacitor is connected to the first node, and a second end thereof is connected to the output node;

a gate of the third transistor is connected to the second ends of the k reset circuits, a first pole thereof is connected to the first node, and a second pole thereof is connected to a second level voltage line;

a gate of the fourth transistor is connected to the second ends of the k reset circuits, a first pole thereof is connected to the output node, and the second pole is connected to the second level voltage line;

a gate and a first pole of the fifth transistor are both connected to a first end of the reset circuit in which the fifth transistor is located, and a second pole thereof is connected to a second end of the reset circuit in which the fifth transistor is located;

where the first pole and the second pole are one of a source and a drain, respectively.

In a possible implementation, the output sub-circuit further includes a sixth transistor, a seventh transistor, an eighth transistor, a ninth transistor, a tenth transistor and an eleventh transistor;

Where a gate of the sixth transistor is connected to a second node, a first pole thereof is connected to the first node, and the second pole thereof is connected to the second level voltage line;

a gate of the seventh transistor is connected to the second node, a first pole of the seventh transistor is connected to the output node, and a second pole of the seventh transistor is connected to the second level voltage line;

a gate of the eighth transistor is connected to a third node, and the second pole of the eighth transistor is connected to the second node; in the shift register circuit with all of the stage numbers in a combination of stage numbers corresponding to the shift register circuit being odd, a first pole of the eight transistor is connected to a second clock signal line; and in the shift register circuit with all of the stage numbers in a combination of stage numbers corresponding to the shift register circuit being even, the first pole of the eight transistor is connected to a first clock signal line;

a gate of the ninth transistor is connected to the first node, a first pole of the ninth transistor is connected to the second node, and a second pole of the ninth transistor is connected to the second level voltage line;

a gate and a first pole of the tenth transistor are both connected to the first pole of the eighth transistor, and a second pole of the tenth transistor is connected to the third node;

a gate of the eleventh transistor is connected to the first node, a first pole of the eleventh transistor is connected to the third node, and the second pole of the eleventh transistor is connected to the second level voltage line.

In a possible implementation, the shift register circuit includes an output sub-circuit, the output sub-circuit includes an output node, and the output sub-circuit further includes a twelfth transistor, in the shift register circuit with all of the stage numbers in a combination of stage numbers corresponding to the shift register circuit being odd, a gate of the twelfth transistor is connected to a second clock signal line; and in the shift register circuit with all of the stage numbers in a combination of stage numbers corresponding to the shift register circuit being even, the gate of the twelfth transistor is connected to a first clock signal line; and the first clock signal line and the second clock signal line provide one of a non-inverted clock signal and an inverted clock signal, respectively;

a first pole of the twelfth transistor is connected to the output node, and a second pole of the twelfth transistor is connected to the second level voltage line;

where the first pole and the second pole are one of a source and a drain, respectively.

In a possible implementation, the output sub-circuit further includes a thirteenth transistor, the first node is connected to the second ends of the k input circuits via the thirteenth transistor, and a first pole of the thirteenth transistor is connected to the second ends of the k input circuits, and a second pole of the thirteenth transistor is connected to the first node;

in the shift register circuit with all of the stage numbers in a combination of stage numbers corresponding to the shift register circuit being odd, a gate of the thirteenth transistor is connected to a second clock signal line; and in the shift register circuit with all of the stage numbers in a combination of stage numbers corresponding to the shift register circuit being even, the gate of the thirteenth transistor is connected to a first clock signal line.

In a second aspect, there is further provided in the present disclosure a driving method of any one of the above-mentioned scan driving circuits. The method includes:

applying the external control signal to the scan driving circuit to cause the shift register circuit to output a scanning signal to the output end at the p-th stage from a first toggling time of a clock signal after being switched to a charged state when the input circuit at the p-th stage switches the connected shift register circuit to the charged state;

where p is any integer greater than 0 and less than m+1.

In a third aspect, there is further provided in the present disclosure a sub-circuit of a scan driving circuit, where the scan driving circuit includes output ends at m stages, the sub-circuit includes a shift register circuit and k input circuits, the input circuits in the scan driving circuit have m stages, and k is greater than 1 and less than m;

Where a first end of the input circuit at the i-th stage is connected to the output end at the (i−1)-th stage, and i is any integer greater than 1 and less than m+1;

the shift register circuits are respectively connected to k output ends and connected to second ends of the k input circuits, the k input circuits have a same combination of stage numbers as the k output ends, all of the stage numbers in the same combination of stage numbers have a same parity;

the shift register circuit is configured to output a scanning signal to one of the connected k output ends, and outputting the scanning signal to which one of the output ends is indicated by an external control signal.

In a possible implementation, the input circuit is configured to switch the shift register circuit connected to a second end of the input circuit to a charged state when a first end of the input circuit receives the scanning signal; the shift register circuit is configured to output the scanning signal to one of the connected k output ends from a first toggling time of a clock signal after being switched to the charged state.

In a possible implementation, the sub-circuit further includes k reset circuits, and the reset circuits in the scan driving circuit have m stages;

Where a first end of the reset circuit at the j-th stage is connected to the output end at the (j+1)-th stage, and j is any integer greater than 0 and less than m;

the shift register circuit is connected to second ends of k reset circuits, and the k reset circuits have a same combination of stage numbers as the k output ends;

the reset circuit is configured to cause the shift register circuit connected to a second end of the reset circuit to stop outputting the scanning signal when a first end of the reset circuit receives the scanning signal.

In a possible implementation, the external control signal is provided by k control signal lines, the shift register circuit includes an output sub-circuit and k transistors, and the output sub-circuit includes an output node;

where the output sub-circuit is configured to output a scanning signal to the output node;

each of first poles of the k transistors is connected to the output node;

each of gates of the k transistors is connected to one of the k control signal lines;

each of second poles of the k transistors is connected to one of the k output ends;

where the first pole and the second pole are one of a source and a drain, respectively.

In a possible implementation, the shift register circuit includes an output sub-circuit including an output node; and the output sub-circuit further includes a first transistor and a first capacitor, the input circuit includes a second transistor;

where a gate of the first transistor is connected to a first node, and a second pole of the first transistor is connected to the output node; and the first node of the first transistor is connected to the second ends of the k input circuits;

in the shift register circuit with all of the stage numbers in a combination of stage numbers corresponding to the shift register circuit being odd, a first pole of the first transistor is connected to a first clock signal line; in the shift register circuit with all of the stage numbers in a combination of stage numbers corresponding to the shift register circuit being even, the first pole of the first transistor is connected to a second clock signal line; the first clock signal line and the second clock signal line provide one of a non-inverted clock signal and an inverted clock signal, respectively;

a first end of the first capacitor is connected to the first node, and a second end of the first capacitor is connected to the output node;

a gate of the second transistor is connected to a first end of the input circuit, a first pole of the second transistor is connected to a first level voltage line or a first end of the input circuit in which the second transistor is located, and a second pole of the second transistor is connected to a second end of the input circuit in which the second transistor is located;

where the first pole and the second pole are one of a source and a drain, respectively.

In a possible implementation, the shift register circuit includes an output sub-circuit including an output node; and the output sub-circuit further includes a first transistor, a first capacitor, a third transistor, and a fourth transistor; the reset circuit includes a fifth transistor;

where a gate of the first transistor is connected to a first node, a second pole of the first transistor is connected to the output node; and the first node is connected to the second ends of the k input circuits;

in the shift register circuit with all of the stage numbers in a combination of stage numbers corresponding to the shift register circuit being odd, a first pole of the first transistor is connected to a first clock signal line; in the shift register circuit with all of the stage numbers in a combination of stage numbers corresponding to the shift register circuit being even, the first pole of the first transistor is connected to a second clock signal line; the first clock signal line and the second clock signal line provide one of a non-inverted clock signal and an inverted clock signal, respectively;

a first end of the first capacitor is connected to the first node, and a second end of the first capacitor is connected to the output node;

a gate of the third transistor is connected to the second ends of the k reset circuits, a first pole of the third transistor is connected to the first node, and a second pole of the third transistor is connected to a second level voltage line;

a gate of the fourth transistor is connected to the second ends of the k reset circuits, a first pole of the fourth transistor is connected to the output node, and a second pole of the fourth transistor is connected to the second level voltage line;

a gate and a first pole of the fifth transistor are both connected to a first end of the reset circuit, and a second pole of the fifth transistor is connected to a second end of the reset circuit;

where the first pole and the second pole are one of a source and a drain, respectively.

In a fourth aspect, there is further provided in the present disclosure an array substrate, including any one of the above-mentioned scan driving circuits.

In a fifth aspect, there is further provided in the present disclosure a display device, including any one of the above-mentioned array substrates.

DETAILED DESCRIPTION

In order to make the principles and advantages of the present disclosure more clear, embodiments of the present disclosure will be further described in detail below with reference to the accompanying drawings.

Figure 1:
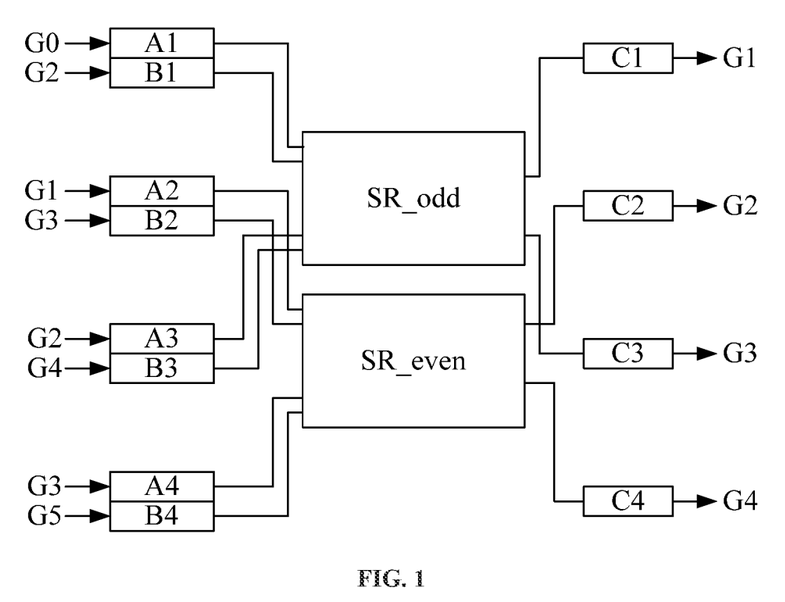
FIG. 1 is a block diagram of a structure of a scan driving circuit provided in an embodiment of the present disclosure.
Figure 2:
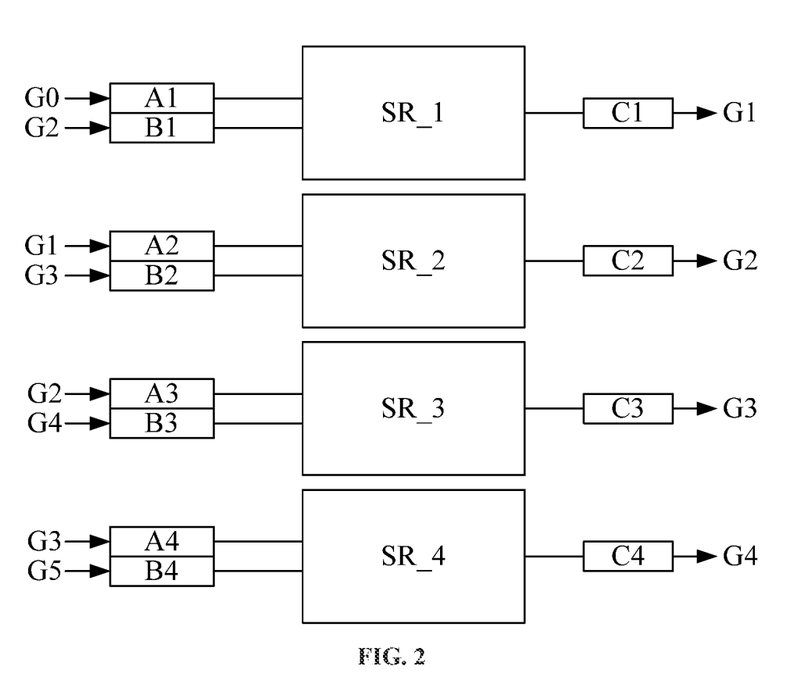
FIG. 2 is a block diagram of a structure of a scan driving circuit provided in a comparative example of the present disclosure.
Figure 3:
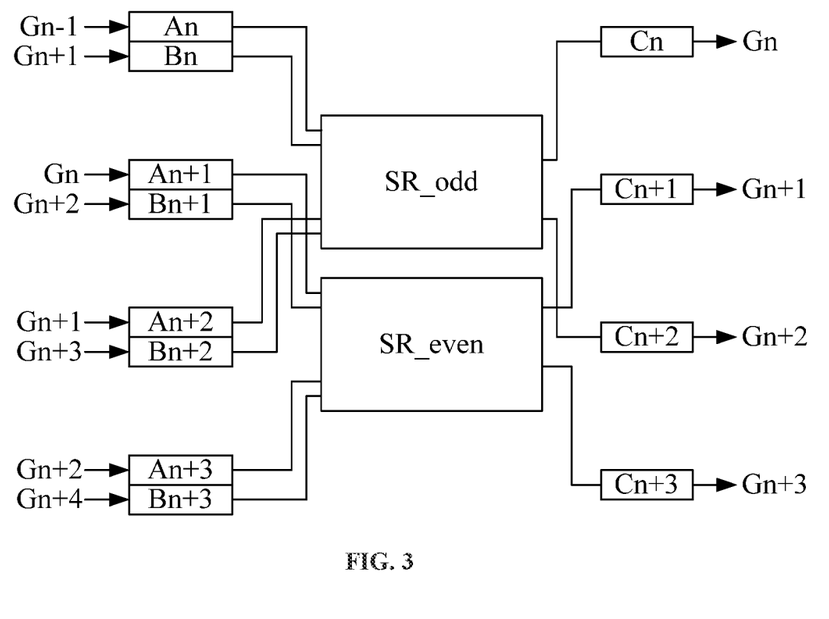
FIG. 3 is a block diagram of a structure of a part of a scan driving circuit provided in an embodiment of the present disclosure.

FIGS. 1 to 3 show several circuit structures of a scan driving circuit according to an embodiment of the present disclosure. In an embodiment of the present disclosure, the scan driving circuit includes output ends at m stages, input circuits at m stages, and q shift register circuits, where m is a positive integer greater than 1, and q is a positive integer less than m, and specific values thereof may be determined based on the actual application requirements.

In a general example of the present disclosure, the scan driving circuit includes output ends at m stages, input circuits at m stages, and q shift register circuits, and q is a positive integer less than an integer m.

Herein, a first end of the input circuit at the i-th stage is connected to the output end at the (i−1)-th stage, and i is any integer greater than 1 and less than m+1.

Any one of the shift register circuits is respectively connected to k output ends, and is connected to second ends of the k input circuits; the k input circuits have a same combination of stage numbers as the k output ends, all of the stage numbers in the same combination of stage numbers have the same parity, and k is greater than 1 and less than m.

The shift register circuit is configured to be able to output a scanning signal to one of the connected k output ends, and outputting the scanning signal to which one of the output terminals is indicated by an external control signal.

In another general example of the present disclosure, the scan driving circuit further includes reset units at m stages and has a circuit structure as follows.

An input circuit has a connection relationship with an output end as follows: for any integer i greater than 1 and less than m+1, a first end of the input circuit at the i-th stage is connected to the output end at the (i−1)-th stage.

The reset circuit has a connection relationship with the output end as follows: for any integer j greater than 0 and less than m, a first end of the reset circuit at the j-th stage is connected to the output end at the (j+1)-th stage.

The shift register circuit has a connection relationship with others as follows: any one of the shift register circuits is connected to each of second ends of k input circuits, is connected to each of second ends of k reset circuits, and is respectively connected to each of k output ends (k is an integer greater than 1 and less than m). Moreover, the k input circuits have a same combination of stage numbers as the k output ends, and the k reset circuits also have a same combination of stage numbers as the k output ends. Furthermore, all of the stage numbers in the same combination of stage numbers have the same parity.

With respect to functions of the circuits, the input circuit is configured to switch the shift register circuit connected to a second end of the input circuit to a charged state when a first end of the input circuit receives a scanning signal; the shift register circuit is configured to output the scanning signal to one of the connected k output ends from a first toggling time of a clock signal after being switched to the charged state, and outputting the scanning signal to which one of the output terminals is indicated by an external control signal; and the reset circuit is configured to cause the shift register circuit connected to a second end of the reset circuit to stop outputting the scanning signal when the first end of the reset circuit receives the scanning signal.

In an example, the scan driving circuit described above has a structure shown in FIG. 1. For convenience of description, a combination of a capital letter "A" and a figure, in this context, represents an input circuit at a certain stage (e.g., "A3" represents an input circuit at a third stage), a combination of a capital letter "B" and a figure represents a reset circuit at a certain stage (e.g., "Bn" represents a reset circuit at an n-th stage), a combination of a capital letter "C" and a figure represents an output end at a certain stage (e.g., "Cn+1" represents an output end at an (n+1)-th stage), and a combination of a capital letter "G" and a figure represents a scanning signal at a certain stage (i.e., corresponding to a certain stage number) (e.g., "G0" represents an initial scanning signal, "G2" represents a scanning signal outputted from an output end at a second stage). For clarity of illustration, a same reference sign of the scanning signal represents two nodes connected to each other (for example, C1 is connected to G1 and G1 is connected to A2 in FIG. 1, indicating that an output end C1 at the first stage is connected to a first end of an input circuit A2 at the second stage).

Referring to FIG. 1, the scan driving circuit according to this example includes a shift register unit SR_odd and a shift register unit SR_even. Furthermore, the scan driving circuit further includes output ends at four stages, input circuits at four stages, and reset circuits at four stages. Herein, the shift register circuit SR_odd is connected to second ends of two input circuits, and is connected to second ends of two reset circuits, and is respectively connected to two output ends (the combination of stage numbers is {1, 3}, and all of the stage numbers therein are odd). The shift register circuit SR_even is connected to second ends of two input circuits, and is connected to second ends of two reset circuits, and is respectively connected to two output ends (the combination of stage numbers is {2, 4}, and all of the stage numbers therein are even). It can be seen that in this example, m=4, q=2, and k=2.

As shown in FIG. 1, a first end of an input circuit A2 at the second stage is connected to an output end C1 at the first stage, a first end of an input circuit A3 at the third stage is connected to an output end C2 at the second stage, and a first end of an input circuit A4 at the fourth stage is connected to an output end C3 at the third stage, that is, the connection relationship is: "a first end of an input circuit at the i-th stage is connected to an output end at the (i−1)-th stage" (1<i<m+1).

As shown in FIG. 1, a first end of a reset circuit B1 at the first stage is connected to an output end C2 at the second stage, and a first end of a reset circuit B2 at the second stage is connected to an output end C3 at the third stage, and a first end of a reset circuit B3 at the third stage is connected to an output end C4 at the fourth stage, that is, the connection relationship is: "a first end of a reset circuit at the j-th stage is connected to an output end at the (j+1)-th stage" (0<j<m).

Based on the above-described functions of the circuits, and with reference to FIG. 1, the operating principle of the scan driving circuit according to this example is as follows:

When a first end of an input circuit A1 at the first stage receives an initial scanning signal G0 which is externally provided, the shift register circuit SR_odd connected to a second end of the input circuit A1 is switched to a charged state. With the appropriate cooperation of an external control signal, the shift register circuit SR_odd can output a scanning signal G1 to the connected output end C1 from a first toggling time of the clock signal thereafter (i.e., at this point, the output end C1 is one of all output ends to which the shift register circuit SR_odd is connected, which is indicated by the external control signal). Meanwhile, since the scanning signal G1 outputted from the output end C1 is connected to a first end of a second input circuit A2, the second input circuit A2 switches the shift register circuit SR_even connected to a second end of the second input circuit A2 to the charged state.

At a second toggling time of the clock signal thereafter, the shift register circuit SR_even can start outputting a scanning signal G2 to the connected output end C2 with the appropriate cooperation of the external control signal (i.e., at this point, the output end C2 is one of all output ends to which the shift register circuit SR_even is connected, which is indicated by the external control signal). Meanwhile, since the scanning signal G2 outputted from the output end C2 is connected to a first end of the input circuit A3 and a first end of the reset circuit B1, the reset circuit B1 may cause the shift register circuit SR_odd connected to a second end of the reset circuit B1 to stop outputting the scanning signal G1, and the input circuit A3 may switch the shift register circuit SR_odd connected to a second end of the input circuit A3 to the charged state, that is, at this point, the shift register circuit SR_odd is in the charged state, but does not output the scanning signal.

At a third toggling time of the clock signal thereafter, the shift register circuit SR_odd can start outputting a scanning signal G3 to the connected output end C3 with the appropriate cooperation of the external control signal (i.e., at this point, the output end C3 is one of all output ends to which the shift register circuit SR_odd is connected, which is indicated by the external control signal). Meanwhile, since the scanning signal G3 outputted from the output end C3 is connected to a first end of the input circuit A4 and a first end of the reset circuit B2, the reset circuit B2 may cause the shift register circuit SR_even connected to a second end of the reset circuit B2 to stop outputting the scanning signal G2, and the input circuit A4 may switch the shift register circuit SR_even connected to a second end of the input circuit A4 to the charged state, that is, at this point, the shift register circuit SR_even is in the charged state, but does not output the scanning signal.

At a fourth toggling time of the clock signal thereafter, the shift register circuit SR_even can start outputting a scanning signal G4 to the connected output end C4 with the appropriate cooperation of the external control signal (i.e., at this point, the output end C4 is one of all output ends to which the shift register circuit SR_even is connected, which is indicated by the external control signal). Meanwhile, since the scanning signal G4 outputted from the output end C4 is connected to a first end of the reset circuit B3, the reset circuit B3 may cause the shift register circuit SR_odd connected to a second end of the reset circuit B3 to stop outputting the scanning signal G3, and it is to be appreciated that the shift register circuit SR_odd will not output the scanning signal until it is switched to the charged state next time.

For example, from the fourth toggling time of the clock signal thereafter, a scanning signal is inputted from the outside of the scan driving circuit to the reset end B4, so that the reset circuit B4 may cause the shift register circuit SR_even connected to a second end of the reset circuit B4 to stop outputting the scanning signal G4, it is to be appreciated that the shift register circuit SR_even will not output the scanning signal until it is switched to the charged state next time.

Based on the above operating principle, the scan driving circuit according to this example can realize the stage-by-stage output of the scanning signal at the output ends from the first to fourth stages with the above-described cooperation of the external signal. The first end of the input circuit A1 at the first stage forms an input end of the scan driving circuit, the first end of the reset circuit B4 at the fourth stage forms an reset end of the scan driving circuit, and the output ends at the first to fourth stages form four output ends of the scan driving circuit.

It should be noted in the above operating principle that, the above "the toggling time of the clock signal" may be a time when a rising edge and/or a falling edge of the clock signal connected to the shift register circuit is present; it may be seen that it controls the timing of the stage-by-stage output of the scanning signal, and thus the clock signal may be configured according to the desired timing in an implementation. For example, a combination of a non-inverted clock signal and an inverted clock signal may be used as a clock signal connected to the shift register circuit, and the time when the level is toggled may be used as the above-mentioned toggling time of the clock signal, and may not be limited thereto.

It should also be noted in the above operating principle that, the above "external control signal" refers to an external signal connected to the shift register circuit, which may control the shift register circuit to output the scanning signal to which one of the connected output ends. The external control signal may be inputted into the scan driving circuit via, for example, a circuit structure of a timing controller together with the clock signal, may also be connected to the scan driving circuit via an external circuit interface, and may not be limited thereto.

It should also be noted in the above operating principle that, the above-mentioned "charged state" refers to an operating state of the shift register circuit, and the shift register circuit that is switched to the charged state may start to output a scanning signal from a first toggling time of the clock signal. In an implementation, the shift register circuit spontaneously recovers from the charged state after stopping outputting the scanning signal; in another implementation, the reset circuit may recover the connected shift register circuit from the charged state when a first end of the reset circuit receives a scanning signal and the connected shift register circuit is not switched to the charged state by any input circuits. Thus, it is possible to reduce the error output or signal noise caused by the long time that the shift register circuit is maintained in the charged state.

Referring to FIG. 2, in a comparative example, two shift circuits in the scan driving circuit are replaced with shift circuits SR_1, SR_2, SR_3, and SR_4 at four stages on the basis of the structure shown in FIG. 1; and each of the shift circuits is respectively connected to one input circuit, one reset circuit, and one output end that have the same stage numbers with the each of the shift circuits; in this example, the input circuit is configured to switch the shift circuit connected to a second end of the input circuit to a charged state when a first end of the input circuit receives a scanning signal, the shift circuit is configured to start outputting the scanning signal to the connected output end from a first toggling time of the clock signal after being switched to the charged state, and the reset circuit is configured to cause the shift circuit connected to a second end to stop outputting the scanning signal when a first end of the reset circuit receives the scanning signal.

It is easy to infer that the scan driving circuit according to this example can achieve the same signal output as the scan driving circuit shown in FIG. 1 under the same external signal. From a comparison of the circuit structure and the operating principle shown in FIGS. 1 and 2, the shift register circuit SR_odd in the scan driving circuit shown FIG. 1 realizes the functions of the shift circuit SR_1 and the shift circuit SR_3, and the shift register circuit SR_even realizes the functions of the shift circuit SR_2 and the shift circuit SR_4, that is, the scan driving circuit shown in FIG. 1 realizes the simplification of the internal structure of the scan driving circuit through the multiplexing of the circuit structure.

In still another example, the scan driving circuit includes several groups of circuit structures shown in FIG. 3 in addition to the circuit structure shown in FIG. 1. For example, the circuit structure of FIG. 3 with n=5, 9, 13, . . . , 4x+1 (x is a positive integer) may be combined with the circuit structure shown in FIG. 1 to form a scan driving circuit having output ends at 4x+4 stages, and only containing 2x+2 shift register circuits. Each group of the circuit structure shown in FIG. 3 may achieve stage-by-stage output of scanning signal at four stages, according to the same operating principle as that of the circuit structure shown in FIG. 1.

Figure 4:
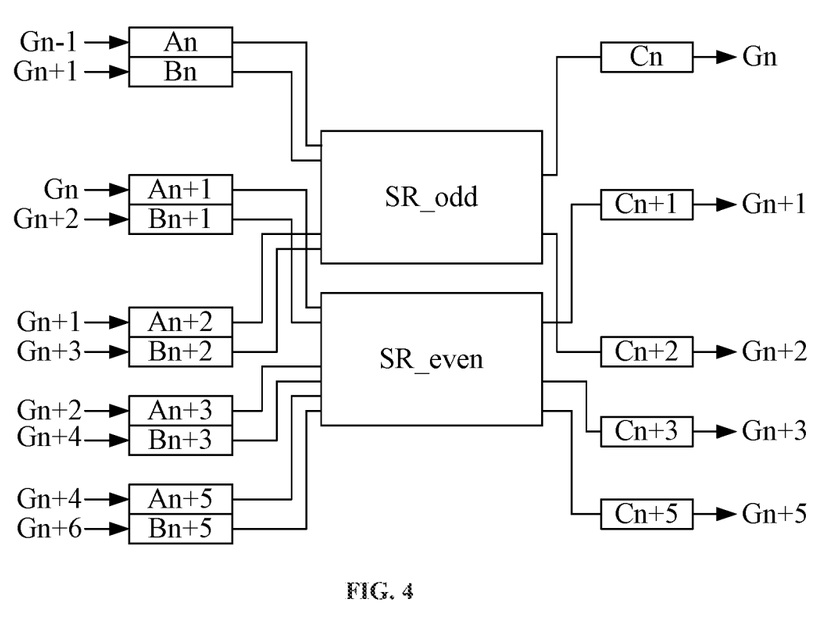
FIG. 4 is a block diagram of a structure of a part of a scan driving circuit provided in an embodiment of the present disclosure.

In yet another example, the scan driving circuit may include a circuit structure, as shown in FIG. 4. Referring to FIG. 4, compared with the circuit structure shown in FIG. 3, the shift register circuit SR_even shown in FIG. 4 is connected to second ends of three input circuits, is connected to second ends of three reset circuits, and is respectively connected to three output ends (all the combinations of stage numbers of the three input circuits, the three reset circuits, and the three output ends are {n+1, n+3, n+5}), and all of the stage numbers therein are odd or even). It will be readily appreciated that the shift register circuit SR_even is functionally equivalent to a combination of shift circuits at three stages, and has a similar operating principle to the shift register circuit SR_even shown in FIG. 1.

For convenience of description, as shown in FIG. 4, a combination of the shift register circuit SR_even, and three input circuits, three reset circuits and three output ends that are connected to the SR_even are hereinafter referred to as a multiplexing group, and the corresponding combination of stage numbers may be a combination of any number of odd numbers within a range of 1 to m, or a combination of any number of even numbers within a range of 2 to m. For example, the scan driving circuit shown in FIG. 1 includes a multiplexing group with a combination of stage numbers being {1, 3} and a multiplexing group with a combination of stage numbers being {2, 4}; the scan driving circuit shown in FIG. 3 includes a multiplexing group with a combination of stage numbers being {n, n+2} and a multiplexing group with a combination of stage numbers being {n+1, n+3}; the scan driving circuit shown in FIG. 4 includes a multiplexing group with a combination of stage numbers being {n, n+2} and a multiplexing group with a combination of stage numbers being {n+1, n+3, n+5}.

Based on the above examples, it can be understood that, in order to realize stage-by-stage output of the scanning signals at the first stage to the m-th stage, {1, 2, 3, . . . , m} may be divided into several groups of combinations of stage numbers consisting of odd numbers and several groups of combinations of stage numbers consisting of even numbers (e.g., {1, 2, 3, . . . , 10} may be divided into {1, 5, 9}, {3, 7}, {2, 8} and {4, 6, 10}), so that multiplexing groups corresponding to each of combinations of stage numbers collectively constitute the scan driving circuit.

Moreover, several individual stage numbers may also be divided out, and a partial circuit structure corresponding to these stage numbers in the scan driving circuit is formed by the shift circuit as shown in FIG. 2 and the input circuit, the reset circuit, and the output end that are connected to the shift circuit (for example, an input circuit, a reset circuit, an output end, and a shift circuit that correspond to a stage number of n+4, are provided in the circuit structure shown in FIG. 3, so as to receive a scanning signal at the (n+3)-th stage and output a scanning signal at the (n+4)-th stage). When at least one combination of stage numbers is divided out, the structure of the scan driving circuit according to any one of the above general examples may be obtained.

It can be seen that in an embodiment of the present disclosure, based on the connection of the shift register circuits to input circuits at multiple stages and output ends at multiple stages, one shift register circuit can be multiplexed among multiple stages, so that the circuit structure may be simplified while maintaining the signal input/output relationship, and the number of transistors required for the gate driver is further reduced on the basis of the existing GOA unit structure, which is helpful for solving the problems that the space occupied by the GOA unit is difficult to compress and the frame thereof is difficult to narrow in the related art, simplifying the structure of the gate driver, reducing the arrangement space of the gate driver, and breaking the bottleneck of related products in the narrowing of the frame.

Figure 5:
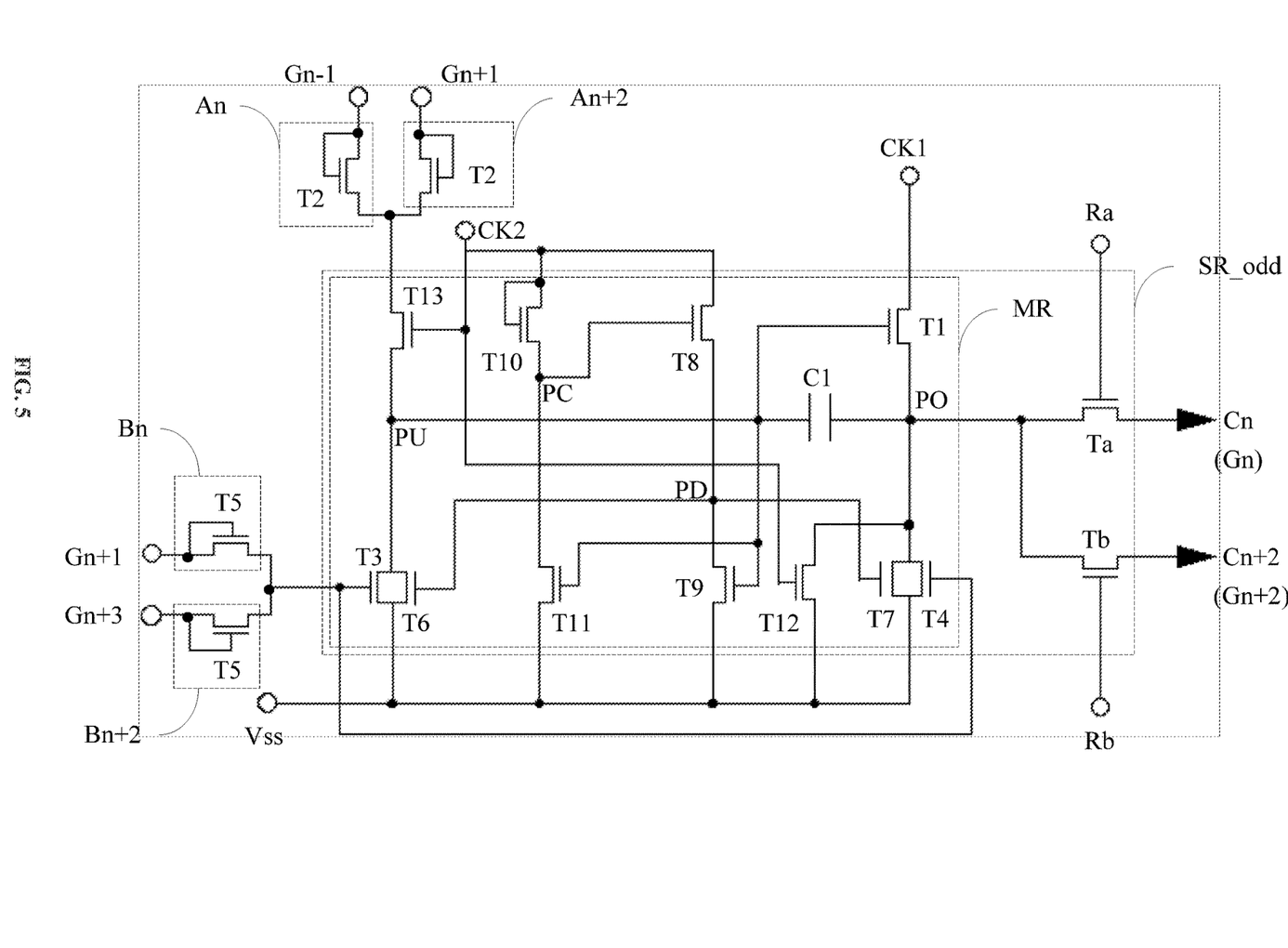
FIG. 5 is a diagram of a circuit structure of a multiplexing group in a scan driving circuit provided in an embodiment of the present disclosure.

FIG. 5 is a diagram of a circuit structure of a multiplexing group provided by an embodiment of the present disclosure, that is, a diagram of a circuit structure of a sub-circuit of a scan driving circuit provided by an embodiment of the present disclosure, which shows an alternative circuit structure of the multiplexing group by taking the circuit structure of the multiplexing group with the combination of stage numbers being {n, n+2} in FIG. 3 and FIG. 4 as an example. It should be noted that all of the transistors shown in FIG. 5 are exemplarily N-type transistors, that is, they may be manufactured through the same manufacturing process to reduce the manufacturing cost. Depending on the specific type of a transistor, the connection relationship respectively possessed by a source and a drain may be set to match the direction of the current flowing through the transistor; when the transistor has a symmetrical structure of the source and the drain, the source and the drain may be regarded as two electrodes that are not particularly distinguished. Hereinafter, the first pole and the second pole refer to one of a source and a drain, respectively.

Referring to FIG. 5, in the multiplexing group of an embodiment:

the above-mentioned external control signal is provided by a first control signal line Ra and a second control signal line Rb, and the number of the control signal lines is k=2; and the above-mentioned shift register circuit SR_odd includes an output sub-circuit MR and transistors Ta and Tb which are used for controlling the output sub-circuit MR to connect to which one of the output ends (hereinafter collectively referred to as "control transistors"), and the number of the control transistors is also k=2. Herein, the output sub-circuit MR has an output node PO that is connected to first poles of k control transistors. The output sub-circuit MR is configured to start outputting a scanning signal to the output node PO from a first clock toggling time after the shift register circuit is switched to a charged state; each of gates of the k control transistors is connected to one of the k control signal lines, each of second poles of the k control transistors is connected to one of the k output ends, forming a circuit connection relationship as shown in FIG. 5. It will be readily understood that, for a multiplexing group with k>2, the number of the control signal lines and the control transistors are still set to be consistent with k.

Based on the circuit structure of this part, when only one of the k control signal lines outputs a gate turn-on voltage, the control transistor that connects to the one of the k control signal lines may turn on and connect the output sub-circuit MR to the corresponding output end, that is, realizing that the scanning signal is output to the output end indicated by the external control signal. And in order to realize the above operating process of the scan driving circuit as shown in FIG. 1, the driving method of the scan driving circuit according to any one of the above general examples may include: applying an external control signal to the scan driving circuit to cause the shift register circuit to output a scanning signal to the output end at the p-th stage from a first toggling time of a clock signal after being switched to a charged state when the input circuit of the p-th stage switches the connected shift register circuit to the charged state; where p is any integer greater than 0 and less than m+1. For example, the above operating principle of the scan driving circuit shown in FIG. 1 refers to the cases of p=1, p=2, p=3, and p=4, respectively, and an example of a waveform of the external control signal which is applied to the scan driving circuit will be given hereafter.

In an embodiment, the above output sub-circuit MR includes a first transistor T1 and a first capacitor C1. Herein, a gate of the first transistor T1 is connected to a first node PU, a first pole thereof is connected to a first clock signal line CK1, and a second pole thereof is connected to an output node PO; the first node PU is indirectly connected to second ends of k input circuits (in yet another example, the first node PU may be directly connected to the second ends of the k input circuits, and the arrangement of a thirteenth transistor M13 is omitted); a first end of the first capacitor C1 is connected to the first node PU, and a second end thereof is connected to the output node PO. Based on this, an output sub-circuit MR can realize the above functions of outputting the scanning signal to the first pole of the connected control transistor from the first clock toggling time after the shift register circuit is switched to the charged state, and the specific implementation is described in detail in the operating principle hereafter.

It should be noted that the above clock signal in an embodiment includes a non-inverted clock signal provided by a first clock signal line CK1 and an inverted clock signal provided by a second clock signal line CK2 (in still another example, the non-inverted clock signal is provided by the second clock signal line CK2, and the inverted clock signal is provided by the first clock signal line CK1), and in terms of connection manner of clock signals, a multiplexing group in which all of the stage numbers in a combination of stage numbers are odd is different from a multiplexing group in which all of the stage numbers in a combination of stage numbers are even.

For example, in the multiplexing group in which all of the stage numbers in a combination of stage numbers are odd, the first pole of the above first transistor T1 is connected to the first clock signal line CK1, and in the multiplexing group in which all of the stage numbers in a combination of the stage numbers are even, the first pole of the first transistor T1 is connected to the second clock signal line CK2. In an embodiment, all of the stage numbers in a combination of stage numbers being odd is described as an example.

In an embodiment, each of the input circuits, i.e., the input circuit An and the input circuit An+2, includes a second transistor T2. In each of the input circuits, a gate of the second transistor T2 is connected to a first end of the input circuit in which the second transistor is located, a first pole thereof is connected to the first end of the input circuit in which the second transistor is located, and a second pole thereof is connected to a second end of the input circuit. Based on this, the input circuit can realize the above functions of switching the shift register circuit connected to the second end of the input circuit to the charged state when the first end of the input circuit receives the scanning signal, and the specific implementation will be described in detail in the operating principle hereafter. In other implementations, the first pole of the above-mentioned second transistor T2 may be connected to a first level voltage line (for example, a signal line loaded with a high level voltage) which is not shown in the drawings, rather than being connected to the first end of the input circuit, which is not limited thereto.

In an embodiment, the above output sub-circuit MR further includes a third transistor T3 and a fourth transistor T4, and each of the reset circuits, i.e., the reset circuit Bn and the reset circuit Bn+2, includes a fifth transistor T5. Herein, a gate of the third transistor T3 is connected to second ends of k reset circuits, a first node thereof is connected to the first node PU, and a second pole thereof is connected to a second level voltage line Vss (for example, a signal line loaded with a low level voltage). A gate of the fourth transistor T4 is connected to the second ends of the k reset circuits, the first pole thereof is connected to the output node PO, and the second pole thereof is connected to the second level voltage line Vss. A gate and a first pole of the fifth transistor T5 are both connected to a first end of the reset circuit in which the fifth transistor is located, and a second pole thereof is connected to a second end of the reset circuit in which the fifth transistor is located. Based on this, the reset circuit may realize the above functions of causing the shift register circuit connected to a second end of the reset circuit to stop outputting a scanning signal when a first end of the reset circuit receives the scanning signal, and the specific implementation will be described in detail in the operating principle hereafter.

In an embodiment, the above output sub-circuit MR further includes a sixth transistor T6, a seventh transistor T7, an eighth transistor T8, a ninth transistor T9, a tenth transistor T10, and an eleventh transistor T11. Herein, a gate of the sixth transistor T6 is connected to a second node PD, the first pole thereof is connected to the first node PU, and a second pole thereof is connected to the second level voltage line Vss. A gate of the seventh transistor T7 is connected to the second node PD, and the first pole thereof is connected to the output node PO, and the second pole thereof is connected to the second level voltage line Vss. A gate of the eighth transistor T8 is connected to a third node PC, and a second pole thereof is connected to the second node PD. In a multiplexing group in which all of the stage numbers in a combination of stage numbers are odd, a first pole of the eighth transistor T8 is connected to the second clock signal line CK2; and in a multiplexing group in which all of the stage numbers in a combination of stage numbers are even, the first pole of the eighth transistor T8 is connected to the first clock signal line CK1. A gate of the ninth transistor T9 is connected to the first node PU, a first pole thereof is connected to the second node PD, and the second pole thereof is connected to the second level voltage line Vss. A gate and a first pole of the tenth transistor T10 are both connected to the first pole of the eighth transistor T8, and a second pole thereof is connected to the third node PC. A gate of the eleventh transistor T11 is connected to the first node PU, the first pole thereof is connected to the third node PC, and the second pole thereof is connected to the second level voltage line Vss. Based on this, the above-mentioned output sub-circuit MR can operate in a more stable state when no scanning signal is output, and the specific principle will be described in detail in the operating principle hereafter.

In an embodiment, the above-mentioned output sub-circuit MR further includes a twelfth transistor T12. In a multiplexing group in which all of the stage numbers in a combination of stage numbers are odd, a gate of the twelfth transistor T12 is connected to the second clock signal line CK2, and in a multiplexing group in which all of the stage numbers in a combination of stage numbers are even, the gate of the twelfth transistor T12 is connected to the first clock signal line CK1. A first pole of the twelfth transistor T12 is connected to the output node PO, and a second pole of the twelfth transistor T12 is connected to the second level voltage line Vss. Based on this, the twelfth transistor T12 can assist in resetting of the signal at the time of stopping outputting the scanning signal, which is advantageous for improving the reset speed and the operating stability of the circuits, and the specific principle thereof will be described in detail in the operating principle hereafter.

In an embodiment, the above-mentioned output sub-circuit MR further includes a thirteenth transistor T13. The above-mentioned first node PU is further connected to the second ends of the k input circuits by means of the thirteenth transistor T13. A first pole of the thirteenth transistor T13 is connected to the second ends of the k input circuits, and the second pole of the thirteenth transistor T13 is connected to the first node PU. In a multiplexing group in which all of the stage numbers in a combination of stage numbers are odd, a gate of the thirteenth transistor T13 is connected to the second clock signal line CK2; in a multiplexing group in which all of the stage numbers in a combination of stage numbers are even, the gate of the thirteenth transistor T13 is connected to the first clock signal line CK1. Based on this, the thirteenth transistor T13 can assist in the switching and restoration of the charged state, which is advantageous for improving the charging speed, the recovery speed, and the operating stability of the circuits, and the specific principle thereof will be described in detail in the operating principle hereafter.

Figure 6:
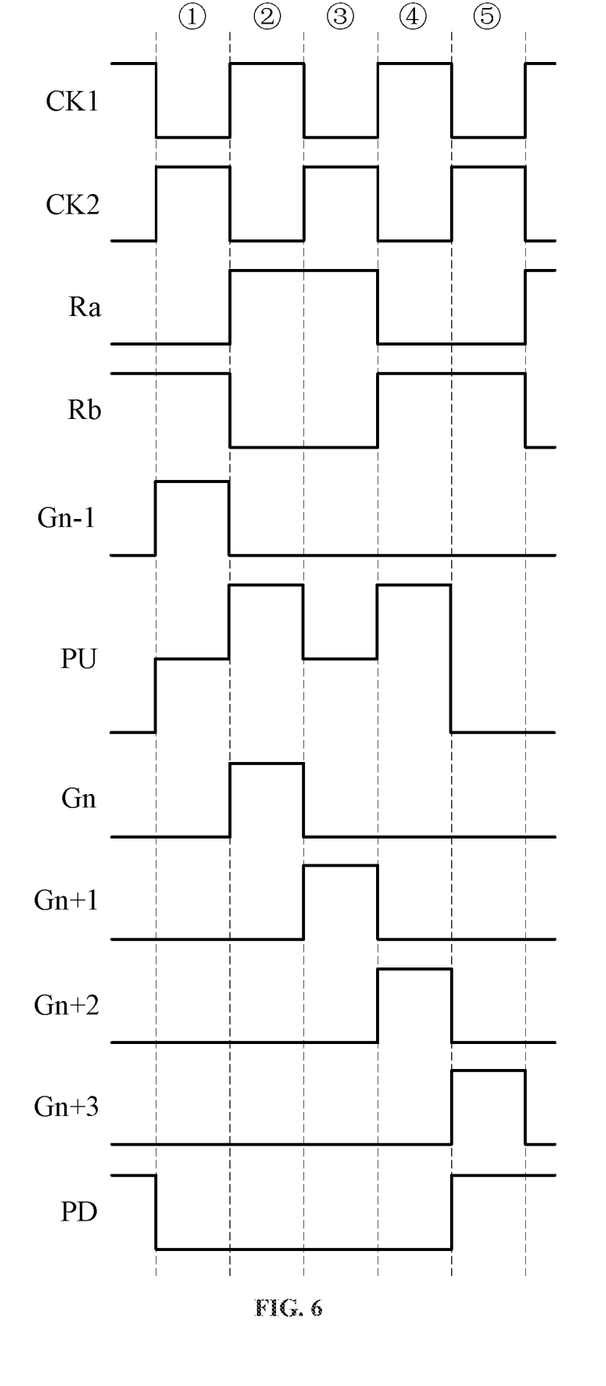
FIG. 6 is a timing diagram of a circuit of a multiplexing group in a scan driving circuit provided in an embodiment of the present disclosure.

Corresponding to the circuit structure of the multiplexing group shown in FIG. 5, FIG. 6 is a timing diagram of a circuit of a multiplexing group in a scan driving circuit provided in an embodiment of the present disclosure. Referring to FIGS. 5 and 6, the operating principle of the multiplexing group is described as follows:

Before the first phase ①, all of the scanning signals involved in the multiplexing group remain at a low level, and thus the second transistor T2, the fifth transistor T5, the third transistor T3, and the fourth transistor T4 all remain turned off. The clock signals on the first clock signal line CK1 and the second clock signal line CK2 periodically toggle with respect to each other, which causes the tenth transistor T10 in all of the output sub-circuits MR to which they are connected to periodically be turned on, so that the third node PC is periodically set at a high level, and then the eighth transistor T8 is turned on, so as to make the second node PD at a high level. Under the action of the high level at the second node PD, the turning-on of the sixth transistor T6 and the seventh transistor T7 causes the first node PU and the output node PO to remain at a low level. The ninth transistor T9 and the eleventh transistor T11 remain turned off, and do not pull down the potential at the second node PD and the third node PC; and the first transistor T1 remains turned off, and does not pull up the potential at the output node PO. Furthermore, the clock signal may cause the twelfth transistor T12 and the thirteenth transistor T13 to be periodically turned on, which is helpful for making the second ends of the k input circuits, the first node PU, and the output node PO remain at a low level. Moreover, the first control signal line Ra and the second control signal line Rb are also loaded with a signal which is periodically toggled, so that the two control transistors Ta and Tb are alternately turned on; and since the output node PO remains at a low level, the potentials at the output end Cn and at the output end Cn+2 are also periodically pulled down, so that the output signal may remain stable.

During the first phase ①, the scanning signal Gn−1 is turned to a high level (i.e., it starts to be outputted), the second clock signal line CK2 is at a high level, and the first clock signal line CK1 is at a low level, so that the second transistor T2 in the input circuit An is turned on, and the thirteenth transistor T13 is turned on, making the first node PU be pulled up to a high level. As a result, the first transistor T1, the ninth transistor T9, and the eleventh transistor T11 are turned on, the second node PD and the third node PC are set at a low level, the pulling down of the potential at the first node PU and output node PO is stopped. Since both of the twelfth transistor T12 and the first transistor T1 are turned on, the output node PO remains at a low level under the combined action of the first clock signal line CK1 and the second level voltage line Vss. During this phase, the first end of the first capacitor C1 is at a high level and the second end thereof is at a low level, that is, the charging for both ends of the capacitor is completed during this phase (i.e., the capacitor is switched to the charged state).

During the second phase ②, the scanning signal Gn−1 is turned to a low level (i.e., it stops to be outputted), the second clock signal line CK2 is at a low level, and the first clock signal line CK1 is at a high level, and the twelfth transistor T12 and the thirteenth transistor T13 are turned off. Under the charge holding action of the first capacitor C1, the first node PU will be turned to a higher level with a higher potential as the first clock signal line CK1 is changed from a low level to a high level. This causes the first transistor T1 to fully be turned on, thereby quickly completing the potential pull-up at the output node PO. At this point, the first control signal line Ra is at a high level and the control transistor Ta is turned on, and thus the output end Cn outputs a high level, that is, the scanning signal Gn starts to be outputted.

During the third phase ③, the scanning signal Gn+1 is turned to a high level (i.e., it starts to be outputted), the second clock signal line CK2 is at a high level, and the first clock signal line CK1 is at a low level, and the first control signal line Ra is at a high level and the control transistor Ta is turned on. Under the action of the high level of the scanning signal Gn+1, the second transistor T2 in the input circuit An+2 and the fifth transistor T5 in the reset circuit Bn are turned on, so that the third transistor T3 pulls down the potential at the first node PU, and the second transistor T2 and the thirteenth transistor T13 pull up the potential at the first node PU. Here, by setting the device parameter relationship among the second transistor T2, the third transistor T3, and the thirteenth transistor T13, the first node PU during this phase maybe at a high level. At this point, the first transistor T1, the fourth transistor T4, and the twelfth transistor T12 are turned on, so that a first pole and a second pole of the control transistor Ta are pulled down to a low level under the combined action of the first clock signal line CK1 and the second level voltage line Vss, that is, the scanning signal Gn stops to be outputted. During this phase, the first end of the first capacitor C1 is at a high level and the second end thereof is at a low level, that is, the charging for both ends of the capacitor is completed during this stage (i.e., the capacitor is switched to the charged state).

In an implementation, it is assumed that source-to-drain equivalent resistances of the second transistor T2, the third transistor T3, and the thirteenth transistor T13 are R2, R3, and R13, respectively, and the high level voltage of the scanning signal is Vgh, the low level voltage on the second level voltage line Vss is Vgl, and the voltage at the first node PU is V1, then:

$$(Vgh-Vgl)/(R2+R3+13)=(Vgh-V1)/(R2+R13)$$

If "the first node PU is at a high level" is equivalent to "V1>0", it may be derived from the combination of two formulas:

$$R3*Vgh+(R2+R13)*Vgl>0$$

Generally, the larger the width-to-length ratio of the transistor channel is, the smaller the source-to-drain equivalent resistance is, thus, by means of corresponding settings, the second transistor T2, the third transistor T3, and the thirteenth transistor T13 may satisfy the above formula, as well as the requirement that the first node PU needs to beat a high level during the third phase ③.

During the fourth phase ④, the scanning signal Gn+1 is turned to a low level (i.e., it stops to be outputted), the second clock signal line CK2 is at a low level, and the first clock signal line CK1 is at a high level, the twelfth transistor T12 and thirteenth transistor T13 are turned off. And under the charge holding action of the first capacitor C1, the first node PU will turned to a higher level with a higher potential as the first clock signal line CK1 changes from a low level to a high level. This causes the first transistor T1 to fully be turned on, thereby quickly completing the potential pull-up at the output node PO. At this point, the second control signal line Rb is at a high level and the control transistor Tb is turned on, and thus the output end Cn+2 outputs a high level, that is, the scanning signal Gn+2 starts to be outputted.

During the fifth phase ⑤, the scanning signal Gn+3 is turned to a high level (i.e., it starts to be outputted), the second clock signal line CK2 is at a high level, and the first clock signal line CK1 is at a low level, and the second control signal line Rb is at a high level and the control transistor Tb is turned on. Under the action of the high level of the scanning signal Gn+3, the fifth transistor T5 in the reset circuit Bn+2 is turned on, so that the third transistor T3 pulls down the potential at the first node PU, and the fourth transistor T4 pulls down the potential at the output node PO. Since there is no second transistor T2 to pull up the potential at the first node PU at this point, the first node PU will be set at a low level. Thus, the ninth transistor T9 stops pulling down the potential at the second node PD, and the eleventh transistor T11 stops pulling down the potential at the third node PC. Under the action of the high level of the second clock signal line CK2, the tenth transistor T10 is turned on and the third node PC is set at a high level, the eighth transistor T8 is turned on and the second node PD is set to a high level. Under the action of the high level at the second node PD, the turning-on of the sixth transistor T6 and the seventh transistor T7 causes the first node PU and the output node PO to be set to a low level. Thus, a first pole and a second pole of the control transistor Tb are pulled down to a low level under the combined action of the first clock signal line CK1 and the second level voltage line Vss. Thereafter, the multiplexing group will be continuously in the operating state before the above-mentioned first phase ①, until the start of first phase ① of the next cycle.

It can be seen from the above operating principle that the input circuit, the reset circuit, and the shift register circuit all realize their respective functions. Based on the example of multiplexing group shown in FIG. 5, it is possible to obtain a circuit structure of a multiplexing group with a combination of other stage numbers. On this basis, it can realize the above functions of the scan driving circuit under the cooperation with a clock signal and an external control signal, and obviously, it may have a lower number of transistors than the existing structure.

It should be noted in the above operating principle that the transistors included in the shift register circuit are not all necessary to achieve the functions, for example, in the case where the thirteenth transistor T13 and the twelfth transistor T12 are not provided, the circuit timing shown in FIG. 6 may still be implemented, but their provision helps to optimize the signal output characteristics of the shift register circuit. Moreover, the elements included in the shift register circuit described above do not need to be all provided in the scan driving circuit, and for example, the two control transistors Ta and Tb may be provided at arbitrary positions between the gate driver and the row scanning lines. In addition, the output sub-circuit MR as shown in FIG. 5 may be used as the above-described shift circuit corresponding to the odd stage numbers, and the output sub-circuit MR, after the first clock signal line CK1 and the second clock signal line CK2 are exchanged, may be used as the above-described shift circuit corresponding to the even stage numbers, which is not limited thereto.

Furthermore, since the provision of the control transistors Ta and Tb separates the signal output end of the output sub-circuit from the row scanning lines to some extent, the noise reduction function performed by elements such as the fourth transistor T4, the seventh transistor T7, and the twelfth transistor T12 will be weakened to some extent. Thus, a reset transistor may be provided for the output end at each stage (a first pole thereof is connected to the output end at a certain stage, a second pole thereof is connected to the second level voltage line, and a gate thereof is connected to a second end of the reset circuit of the same stage number, a second node in the shift register circuit of the same stage number, or a clock signal that does not affect the output of the scanning signal). Moreover, in the case where the reset transistor has the same functions as at least one of the fourth transistor T4, the seventh transistor T7, and the twelfth transistor T12 described above to some extent, only one function mentioned above may be retained or two functions may be combined with each other according to application requirements, so as to achieve better signal output characteristics. For example, for the multiplexing group shown in FIG. 5, the first pole of any one or more of the fourth transistor T4, the seventh transistor T7, and the twelfth transistor T12 may instead be connected to a second end of the control transistor Ta or a second end of the control transistor Tb, and the number of any one or more of the fourth transistor T4, the seventh transistor T7, and the twelfth transistor T12 may be set to two, so that the first poles of the two transistors are respectively uniquely connected to the second end of the control transistor Ta and the second end of the control transistor Tb for eliminating the noise better.

On the basis of any of the scan driving circuits provided herein, the setting of reset circuits at m stages may be replaced by the following manner while keeping the output timing of the scan driving circuit unchanged: the shift register circuit is configured to stop outputting the scanning signal when the first level on the connected reset clock signal line is received. When the shift register circuit outputs the scanning signal to the connected output end, the connected reset clock signal line is at a level other than the first level. In an example, a reset clock signal line to which the shift register circuit having odd stage numbers is connected is a second clock signal line, and a reset clock signal line to which the shift register circuit having even stage numbers is connected is a first clock signal line.

For example, the gate of the third transistor T3 and the gate of the fourth transistor T4 may instead be connected to the second clock signal line CK2 on the basis of the circuit structure shown in FIG. 5. As shown in FIG. 6, the second clock signal line CK2 can replace the role of the scanning signal Gn+1 in the third phase ③ and replace the role of the scanning signal Gn+3 in the fifth phase ⑤, meanwhile, the second clock signal line CK2 does not affect the output of the scanning signal Gn in the second phase ② and does not affect the output of the scanning signal Gn+2 in the fourth phase ④, only impedes the potential pull-up at the first node PU in the first phase ① and makes the first node PU in the first phase ① at a high level based on the same reason that the first node PU in the third stage ③ is at a high level.

It can be seen that even if without the provision of above-mentioned reset circuits at m stages, the multiplexing of the shift register circuits among multiple stages still can be implemented in the embodiment of the present disclosure, based only on the connection of the shift register circuit to input circuits at multiple stages and output ends at multiple stages, so that the circuit structure may be simplified while maintaining the signal input/output relationship, thereby realizing the simplification of the structure of the gate driver.

On the basis of any of the scan driving circuits provided herein, the configurations of the input circuit and the shift register circuit may be changed in the following manner while keeping the output timing of the scan driving circuit unchanged: the input circuit is configured to cause the shift register circuit to enter a first mode when the first end receives the scanning signal, and the shift register circuit is configured to enter a second mode when the triggering signal is received in the first mode, and to output a scanning signal to one of the connected k output ends in the second mode, and outputting the scanning signal to which one of the output ends is indicated by an external control signal. At this point, the reset circuit may be configured to cause the shift register circuit to exit the second mode when the first end receives the scanning signal. After exiting, if any one of the input circuits connected to the shift register circuit is in an operating state, the shift register circuit returns to the first mode; otherwise, the shift register circuit directly exits the second mode and the first mode until it entries the first mode next time.

In an example, the first mode is the charged state described above, the triggering signal is the toggling of the clock signal described above, and the second mode is the operating state of the shift register circuit when it outputs a scanning signal to one of the connected k output ends, as described above. In still another example, the output sub-circuit in the shift register circuit is equivalent to a shift register, and the first mode is the state of the level when the shift register stores the scanning signal, and the triggering signal is, for example, the state of the level when a trigger shift register on the falling edge or rising edge outputs the stored scanning signal.

It can be seen that even if the configurations of the input circuits and the shift register circuits described above are changed in the manner described above, the multiplexing of the shift register circuits among multiple stages can still be implemented in the embodiments of the present disclosure based on the connection of the shift register circuits to input circuits at multiple stages and output ends at multiple stages, so that the circuit structure may be simplified while maintaining the signal input/output relationship, thereby realizing simplification of the structure of the gate driver.

Based on the same inventive concept, there is further provided a sub-circuit of a scan driving circuit in the present disclosure. The scan driving circuit includes output ends at m stages, the sub-circuit includes a shift register circuit and k input circuits, the input circuits in the scan driving circuit have a total of m stages, and k is greater than 1 and less than m.

Herein, a first end of the input circuit at the i-th stage is connected to the output end at the (i−1)-th stage, and i is any integer greater than 1 and less than m+1.

The shift register circuits are respectively connected to k output ends, and connected to second ends of the k input circuits, the k input circuits have the same combination of stage numbers as the k output ends, and all of the stage numbers in the same combination of stage numbers have the same parity.

The shift register circuit is configured to be able to output a scanning signal to one of the connected k output ends, and outputting the scanning signal to which one of the output ends is indicated by an external control signal.

In a possible implementation, the input circuit is configured to switch the shift register circuit connected to a second end to a charged state when a first end of the input circuit receives the scanning signal; the shift register circuit is configured to output the scanning signal to one of the connected k output ends from a first toggling time of a clock signal after being switched to the charged state.

In a possible implementation, the sub-circuit further includes k reset circuits, and the reset circuits in the scan driving circuit have m stages.

Herein, a first end of the reset circuit at the j-th stage is connected to the output end at the (j+1)-th stage, and j is any integer greater than 0 and less than m.

The shift register circuit is connected to second ends of k reset circuits, and the k reset circuits have the same combination of stage numbers as the k output ends.

The reset circuit is configured to cause the shift register circuit connected to a second end of the reset circuit to stop outputting the scanning signal when a first end of the reset circuit receives the scanning signal.

It should be understood that any one of the multiplexing groups described above may be regarded as an example of an implementation of a sub-circuit according to an embodiment of the present disclosure, and the repeating manner of the multiplexing group in the scan driving circuit hereinbefore has been also described in detail, which is not repeated here.

It can be seen that, based on the connection of the shift register circuits to input circuits at multiple stages and output ends multiple stages, one shift register circuit among multiple stages can be multiplexed in the embodiments of the present disclosure, so that the circuit structure may be simplified while maintaining the signal input/output relationship, and the number of transistors required for the gate driver is further reduced on the basis of the existing GOA unit structure, which is advantageous for simplifying the structure of the gate driver, reducing the arrangement space of the gate driver, and breaking the bottleneck of related products in the narrowing of the frame.

Based on the same inventive concept, there is further provided an array substrate in an embodiment of the present disclosure, which includes any one of the scan driving circuits described above. Based on the characteristic that the scan driving circuit occupies a small space, the GOA area on the array substrate may be designed to be smaller, which helps to achieve a narrower display frame.

Based on the same inventive concept, there is further provided a display device in an embodiment of the present disclosure, which includes any one of array substrates. The display device in the embodiments of the present disclosure may be any product or component having a display function, such as a mobile phone, a tablet computer, a television, a display, a notebook computer, a digital photo frame, a navigator, and the like. Based on the characteristic that the scan driving circuit occupies a small space, the display device may have a narrower display frame.

The foregoing descriptions are merely some embodiments of the present disclosure, and are not intended to limit the present disclosure. Within the spirit and principles of the present disclosure, any modifications, equivalent substitutions, improvements, etc., are within the protection scope of the present disclosure.

What is claimed is:

1. A scan driving circuit, comprising: output ends at m stages, input circuits at m stages, and q shift register circuits, and q is a positive integer less than an integer m;
   wherein a first end of the input circuit at the i-th stage is connected to the output end at the (i−1)-th stage, and i is any integer greater than 1 and less than m+1;
   any one of the shift register circuits is respectively connected to k output ends, and connected to second ends of k input circuits, and the k input circuits have a same combination of stage numbers as the k output ends, all of the stage numbers in the same combination of stage numbers have a same parity, and k is greater than 1 and less than m; and
   the shift register circuit is configured to output a scanning signal to one of the connected k output ends, and outputting the scanning signal to which one of the output ends is indicated by an external control signal.

2. The scan driving circuit according to claim 1, wherein the input circuit is configured to switch the shift register circuit connected to a second end of the input circuit to a charged state when a first end of the input circuit receives a scanning signal; the shift register circuit is configured to output the scanning signal to one of the connected k output ends from a first toggling time of a clock signal after being switched to the charged state.

3. The scan driving circuit according to claim 1, wherein the scan driving circuit further comprises reset circuits at m stages;
   wherein a first end of the reset circuit at the j-th stage is connected to the output end at the (j+1)-th stage; and j is any integer greater than 0 and less than m;
   the shift register circuits respectively connected to the k output ends are further connected to second ends of k reset circuits, and the k reset circuits have a same combination of stage numbers as the k output ends; and
   the reset circuit is configured to cause the shift register circuit connected to a second end of the reset circuit to stop outputting a scanning signal when a first end of the reset circuit receives the scanning signal.

4. The scan driving circuit according to claim 1, wherein the external control signal is provided by k control signal lines, the shift register circuit comprises an output sub-circuit and k transistors, and the output sub-circuit comprises an output node;
   wherein the output sub-circuit is configured to output a scanning signal to the output node;
   each of first poles of the k transistors is connected to the output node;
   each of gates of the k transistors is connected to one of the k control signal lines;
   each of second poles of the k transistors is connected to one of the k output ends;
   wherein the first pole and the second pole are one of a source and a drain, respectively.

5. The scan driving circuit according to claim 1, wherein the shift register circuit comprises an output sub-circuit, the output sub-circuit comprises an output node, and the output sub-circuit further comprises a first transistor and a first capacitor, the input circuit comprises a second transistor;
   wherein a gate of the first transistor is connected to a first node, a second pole of the first transistor is connected to the output node; and the first node is connected to the second ends of k input circuits;
   in the shift register circuit in which all of stage numbers in a combination of stage numbers corresponding to the shift register circuit are odd, a first pole of the first transistor is connected to a first dock signal line; and in the shift register circuit in which all of stage numbers in a combination of stage numbers corresponding to the shift register circuit are even, the first pole of the first transistor is connected to a second dock signal line, and the first dock signal line and the second dock signal line provide one of a non-inverted dock signal and an inverted dock signal, respectively;
   a first end of the first capacitor is connected to the first node, and a second end of the first capacitor is connected to the output node;
   a gate of the second transistor is connected to a first end of the input circuit, the first pole of the second transistor is connected to a first level voltage line or the first end of the input circuit in which the second transistor is located, and a second pole of the second transistor is connected to the second end of the input circuit in which the second transistor is located;
   wherein the first pole and the second pole are one of a source and a drain, respectively.

6. The scan driving circuit according to claim 3, wherein the shift register circuit comprises an output sub-circuit, the output sub-circuit comprises an output node, and the output sub-circuit further comprises a first transistor, a first capacitor, a third transistor, and a fourth transistor; the reset circuit comprises a fifth transistor;
   wherein a gate of the first transistor is connected to a first node, a second pole of the first transistor is connected to the output node; and the first node is connected to the second ends of k input circuits;
   in the shift register circuit in which all of stage numbers in a combination of stage numbers corresponding to the shift register circuit are odd, a first pole of the first transistor is connected to a first clock signal line; and in the shift register circuit in which all of stage numbers in a combination of stage numbers corresponding to the shift register circuit are even, the first pole of the first transistor is connected to a second clock signal line; and the first clock signal line and the second clock signal line provide one of a non-inverted clock signal and an inverted clock signal, respectively;

a first end of the first capacitor is connected to the first node, and a second end thereof is connected to the output node;
a gate of the third transistor is connected to the second ends of the k reset circuits, a first pole thereof is connected to the first node, and a second pole thereof is connected to a second level voltage line;
a gate of the fourth transistor is connected to the second ends of the k reset circuits, a first pole thereof is connected to the output node, and the second pole is connected to the second level voltage line;
a gate and a first pole of the fifth transistor are both connected to a first end of the reset circuit in which the fifth transistor is located, and a second pole thereof is connected to a second end of the reset circuit in which the fifth transistor is located;
wherein the first pole and the second pole are one of a source and a drain, respectively.

7. The scan driving circuit according to claim 6, wherein the output sub-circuit further comprises a sixth transistor, a seventh transistor, an eighth transistor, a ninth transistor, a tenth transistor and an eleventh transistor;
wherein a gate of the sixth transistor is connected to a second node, a first pole thereof is connected to the first node, and the second pole thereof is connected to the second level voltage line;
a gate of the seventh transistor is connected to the second node, a first pole of the seventh transistor is connected to the output node, and a second pole of the seventh transistor is connected to the second level voltage line;
a gate of the eighth transistor is connected to a third node, and the second pole of the eighth transistor is connected to the second node; in the shift register circuit with all of the stage numbers in a combination of stage numbers corresponding to the shift register circuit being odd, a first pole of the eight transistor is connected to a second clock signal line; and in the shift register circuit with all of the stage numbers in a combination of stage numbers corresponding to the shift register circuit being even, the first pole of the eight transistor is connected to a first clock signal line;
a gate of the ninth transistor is connected to the first node, a first pole of the ninth transistor is connected to the second node, and a second pole of the ninth transistor is connected to the second level voltage line;
a gate and a first pole of the tenth transistor are both connected to the first pole of the eighth transistor, and a second pole of the tenth transistor is connected to the third node;
a gate of the eleventh transistor is connected to the first node, a first pole of the eleventh transistor is connected to the third node, and the second pole of the eleventh transistor is connected to the second level voltage line.

8. The scan driving circuit according to claim 1, wherein the shift register circuit comprises an output sub-circuit, the output sub-circuit comprises an output node, and the output sub-circuit further comprises a twelfth transistor,
in the shift register circuit with all of the stage numbers in a combination of stage numbers corresponding to the shift register circuit being odd, agate of the twelfth transistor is connected to a second clock signal line; and in the shift register circuit with all of the stage numbers in a combination of stage numbers corresponding to the shift register circuit being even, the gate of the twelfth transistor is connected to a first clock signal line; and the first clock signal line and the second clock signal line provide one of a non-inverted clock signal and an inverted clock signal, respectively;
a first pole of the twelfth transistor is connected to the output node, and a second pole of the twelfth transistor is connected to the second level voltage line;
wherein the first pole and the second pole are one of a source and a drain, respectively.

9. The scan driving circuit according to claim 5, wherein the output sub-circuit further comprises a thirteenth transistor,
the first node is connected to the second ends of the k input circuits via the thirteenth transistor, and a first pole of the thirteenth transistor is connected to the second ends of the k input circuits, and a second pole of the thirteenth transistor is connected to the first node;
in the shift register circuit with all of the stage numbers in a combination of stage numbers corresponding to the shift register circuit being odd, a gate of the thirteenth transistor is connected to a second clock signal line; and in the shift register circuit with all of the stage numbers in a combination of stage numbers corresponding to the shift register circuit being even, the gate of the thirteenth transistor is connected to a first clock signal line.

10. A driving method of the scan driving circuit according to claim 1, comprising:
applying the external control signal to the scan driving circuit to cause the shift register circuit to output a scanning signal to the output end at the p-th stage from a first toggling time of a clock signal after being switched to a charged state when the input circuit at the p-th stage switches the connected shift register circuit to the charged state;
wherein p is any integer greater than 0 and less than m+1.

11. A sub-circuit of a scan driving circuit, wherein the scan driving circuit comprises output ends at m stages, the sub-circuit comprises a shift register circuit and k input circuits, the input circuits in the scan driving circuit have m stages, and k is greater than 1 and less than m;
wherein a first end of the input circuit at the i-th stage is connected to the output end at the (i−1)-th stage, and i is any integer greater than 1 and less than m+1;
the shift register circuits are respectively connected to k output ends and connected to second ends of the k input circuits, the k input circuits have a same combination of stage numbers as the k output ends, all of the stage numbers in the same combination of stage numbers have a same parity;
the shift register circuit is configured to output a scanning signal to one of the connected k output ends, and outputting the scanning signal to which one of the output ends is indicated by an external control signal.

12. The sub-circuit according to claim 11, wherein the input circuit is configured to switch the shift register circuit connected to a second end of the input circuit to a charged state when a first end of the input circuit receives the scanning signal; the shift register circuit is configured to output the scanning signal to one of the connected k output ends from a first toggling time of a clock signal after being switched to the charged state.

13. The sub-circuit according to claim 11, wherein the sub-circuit further comprises k reset circuits, and the reset circuits in the scan driving circuit have m stages;
Wherein a first end of the reset circuit at the j-th stage is connected to the output end at the (j+1)-th stage, and j is any integer greater than 0 and less than m;

the shift register circuit is connected to second ends of k reset circuits, and the k reset circuits have a same combination of stage numbers as the k output ends;

the reset circuit is configured to cause the shift register circuit connected to a second end of the reset circuit to stop outputting the scanning signal when a first end of the reset circuit receives the scanning signal.

14. The sub-circuit according to claim 11, wherein the external control signal is provided by k control signal lines, the shift register circuit comprises an output sub-circuit and k transistors, and the output sub-circuit comprises an output node;

wherein the output sub-circuit is configured to output a scanning signal to the output node;

each of first poles of the k transistors is connected to the output node;

each of gates of the k transistors is connected to one of the k control signal lines;

each of second poles of the k transistors is connected to one of the k output ends;

wherein the first pole and the second pole are one of a source and a drain, respectively.

15. The sub-circuit according to claim 11, wherein the shift register circuit comprises an output sub-circuit comprising an output node; and the output sub-circuit further comprises a first transistor and a first capacitor, the input circuit comprises a second transistor;

wherein a gate of the first transistor is connected to a first node, and a second pole of the first transistor is connected to the output node; and the first node of the first transistor is connected to the second ends of the k input circuits;

in the shift register circuit with all of the stage numbers in a combination of stage numbers corresponding to the shift register circuit being odd, a first pole of the first transistor is connected to a first clock signal line; in the shift register circuit with all of the stage numbers in a combination of stage numbers corresponding to the shift register circuit being even, the first pole of the first transistor is connected to a second clock signal line; the first clock signal line and the second clock signal line provide one of a non-inverted clock signal and an inverted clock signal, respectively;

a first end of the first capacitor is connected to the first node, and a second end of the first capacitor is connected to the output node;

a gate of the second transistor is connected to a first end of the input circuit; a first pole of the second transistor is connected to a first level voltage line or a first end of the input circuit in which the second transistor is located, and a second pole of the second transistor is connected to a second end of the input circuit in which the second transistor is located;

wherein the first pole and the second pole are one of a source and a drain, respectively.

16. The sub-circuit according to claim 13, wherein the shift register circuit comprises an output sub-circuit comprising an output node; and the output sub-circuit further comprises a first transistor, a first capacitor, a third transistor, and a fourth transistor; the reset circuit comprises a fifth transistor;

wherein a gate of the first transistor is connected to a first node, a second pole of the first transistor is connected to the output node; and the first node is connected to the second ends of the k input circuits;

in the shift register circuit with all of the stage numbers in a combination of stage numbers corresponding to the shift register circuit being odd, a first pole of the first transistor is connected to a first clock signal line; in the shift register circuit with all of the stage numbers in a combination of stage numbers corresponding to the shift register circuit being even, the first pole of the first transistor is connected to a second clock signal line; the first clock signal line and the second clock signal line provide one of a non-inverted clock signal and an inverted clock signal, respectively;

a first end of the first capacitor is connected to the first node, and a second end of the first capacitor is connected to the output node;

a gate of the third transistor is connected to the second ends of the k reset circuits, a first pole of the third transistor is connected to the first node, and a second pole of the third transistor is connected to a second level voltage line;

a gate of the fourth transistor is connected to the second ends of the k reset circuits, a first pole of the fourth transistor is connected to the output node, and a second pole of the fourth transistor is connected to the second level voltage line;

a gate and a first pole of the fifth transistor are both connected to a first end of the reset circuit, and a second pole of the fifth transistor is connected to a second end of the reset circuit;

wherein the first pole and the second pole are one of a source and a drain, respectively.

17. An array substrate comprising a scan driving circuit, which comprises output ends at m stages, input circuits at m stages, and q shift register circuits, and q is a positive integer less than an integer m;

wherein a first end of the input circuit at the i-th stage is connected to the output end at the (i−1)-th stage, and i is any integer greater than 1 and less than m+1;

any one of the shift register circuits is respectively connected to k output ends, and connected to second ends of k input circuits, and the k input circuits have a same combination of stage numbers as the k output ends, all of the stage numbers in the same combination of stage numbers have a same parity, and k is greater than 1 and less than m; and the shift register circuit is configured to output a scanning signal to one of the connected k output ends, and outputting the scanning signal to which one of the output ends is indicated by an external control signal.

18. A display device comprising the array substrate according to claim 17.

19. The array substrate according to claim 17, wherein the input circuit is configured to switch the shift register circuit connected to a second end of the input circuit to a charged state when a first end of the input circuit receives a scanning signal; the shift register circuit is configured to output the scanning signal to one of the connected k output ends from a first toggling time of a clock signal after being switched to the charged state.

20. The array substrate according to claim 17, wherein the scan driving circuit further comprises reset circuits at m stages;

wherein a first end of the reset circuit at the j-th stage is connected to the output end at the (j+1)-th stage, and j is any integer greater than 0 and less than m;

the shift register circuits respectively connected to the k output ends are further connected to second ends of k reset circuits, and the k reset circuits have a same combination of stage numbers as the k output ends; and the reset circuit is configured to cause the shift register circuit connected to a second end of the reset circuit to stop outputting a scanning signal when a first end of the reset circuit receives the scanning signal.

* * * * *